US006972071B1

(12) United States Patent  (10) Patent No.: US 6,972,071 B1
Tyler  (45) Date of Patent: Dec. 6, 2005

(54) HIGH-SPEED SYMMETRICAL PLASMA TREATMENT SYSTEM

(75) Inventor: James Scott Tyler, Galt, CA (US)

(73) Assignee: Nordson Corporation, Westlake, OH (US)

( * ) Notice: Subject to any disclaimer, the term of this patent is extended or adjusted under 35 U.S.C. 154(b) by 63 days.

(21) Appl. No.: 10/030,723

(22) PCT Filed: Jul. 10, 2000

(86) PCT No.: PCT/US00/18797

§ 371 (c)(1),
(2), (4) Date: Jul. 11, 2002

(87) PCT Pub. No.: WO01/05197

PCT Pub. Date: Jan. 18, 2001

Related U.S. Application Data

(60) Provisional application No. 60/143,577, filed on Jul. 13, 1999.

(51) Int. Cl.⁷ .......................... H01L 21/00; C23C 16/00
(52) U.S. Cl. ........................ 156/345.47; 156/345.51; 156/345.33; 118/715; 118/723 R; 118/728; 204/192.1; 204/298.02; 216/67; 427/534; 438/710
(58) Field of Search ................... 118/723, 715, 723 R, 118/728; 156/345, 345.47, 345.51, 345.33; 204/192.1, 298.02; 216/67; 427/534; 438/710

(56) References Cited

U.S. PATENT DOCUMENTS 3,294,670 A 12/1966 Charschan et al. ......... 204/298
3,641,973 A 2/1972 Shrader ....................... 118/49

4,208,159 A 6/1980 Uehara et al. .............. 414/225

(Continued)

FOREIGN PATENT DOCUMENTS

DE 3935002 4/1991

(Continued)

OTHER PUBLICATIONS

Panasonic Factory Automation Company, *Plasma Cleaning Systems*, Brochure, Nov. 2000.

(Continued)

*Primary Examiner*—Ram N Kackar

(74) *Attorney, Agent, or Firm*—Wood, Herron & Evans, L.L.P.

(57) ABSTRACT

A plasma treatment system (10) and related methods for rapidly treating a workpiece (56) with ions from a plasma having an ion density that is reproducibly uniform and symmetrical. The processing chamber (12) of the plasma treatment system (10) includes a chamber (14) lid having a symmetrical array of apertures (192) and further includes a vacuum distribution baffle (180), which are both configured to uniformly disperse a process gas adjacent the surface of the workpiece (56). The uniform dispersion of process gas and a symmetrical placement of the workpiece within the chamber (12) contribute to providing a uniformly dense plasma of ions adjacent the workpiece (56). A treatment system control (304) automates the operation of the system and controls the flow of process gas, evacuation of the chamber, and the application of the plasma excitation power to minimize the length of a treatment cycle and to optimize the uniformity of the plasma treatment.

17 Claims, 8 Drawing Sheets

U.S. PATENT DOCUMENTS

| | | | |
|---|---|---|---|
| 4,252,595 A | 2/1981 | Yamamoto et al. | 156/345 |
| 4,278,528 A | 7/1981 | Kuehnle et al. | 204/298 |
| 4,318,767 A | 3/1982 | Hijikata et al. | 156/345 |
| 4,336,438 A | 6/1982 | Uehara et al. | 219/121 PG |
| 4,405,435 A | 9/1983 | Tateishi et al. | 204/298 |
| 4,418,639 A | 12/1983 | Wills et al. | 118/50 |
| 4,550,239 A | 10/1985 | Uehara et al. | 219/121 PG |
| 4,550,242 A | 10/1985 | Uehara et al. | 156/345 |
| 4,575,299 A | 3/1986 | Layton | 414/222 |
| 4,584,045 A | 4/1986 | Richards | 156/345 |
| 4,637,853 A | 1/1987 | Bumble et al. | 156/345 |
| 4,705,444 A | 11/1987 | Tullis et al. | 118/729 X |
| 4,770,121 A | 9/1988 | Ebata et al. | 118/686 |
| 4,816,116 A | 3/1989 | Davis | 156/643 |
| 4,816,638 A | 3/1989 | Ukai et al. | 219/121.43 |
| 4,840,702 A | 6/1989 | Schumacher, III | 156/643 |
| 4,889,609 A | 12/1989 | Cannella | 204/298 |
| 5,030,056 A | 7/1991 | Kitayama et al. | 414/749 |
| 5,044,871 A | 9/1991 | Davis et al. | 414/786 |
| 5,079,031 A | 1/1992 | Yamazaki et al. | 118/729 X |
| 5,086,729 A | 2/1992 | Katagiri | 118/729 |
| 5,116,640 A | 5/1992 | Mikami et al. | 118/719 X |
| 5,216,223 A | 6/1993 | Straemke | 219/121.43 |
| 5,259,942 A | 11/1993 | Kempf | 204/298.25 |
| 5,286,296 A | 2/1994 | Sato | 118/719 |
| 5,288,684 A | 2/1994 | Yamazaki et al. | 118/723 E X |
| 5,292,393 A | 3/1994 | Maydan | 156/345 |
| 5,302,077 A | 4/1994 | Sato | 414/609 |
| 5,303,671 A | 4/1994 | Kondo et al. | 118/719 |
| 5,310,410 A | 5/1994 | Begin | 29/25.01 |
| 5,314,298 A | 5/1994 | Kim | 414/797.9 |
| 5,345,056 A | 9/1994 | Frei et al. | 219/121.59 |
| 5,387,265 A | 2/1995 | Kakizaki et al. | 118/730 X |
| 5,413,673 A * | 5/1995 | Fujimoto | 156/345.47 |
| 5,433,371 A | 7/1995 | Morisako | 228/180.5 |
| 5,480,052 A | 1/1996 | Furr et al. | 216/71 |
| 5,492,265 A | 2/1996 | Wandke | 228/205 |
| 5,515,986 A | 5/1996 | Turlot et al. | 156/345 X |
| 5,542,559 A | 8/1996 | Kawakami et al. | 216/67 |
| 5,573,597 A | 11/1996 | Lantsman | 118/723 MP |
| 5,576,629 A | 11/1996 | Turner et al. | 324/709 |
| 5,587,205 A | 12/1996 | Saito et al. | 427/553 |
| 5,605,637 A * | 2/1997 | Shan et al. | 216/71 |
| 5,609,290 A | 3/1997 | Bobbio et al. | 228/206 |
| 5,634,765 A | 6/1997 | Miyoshi | 414/786 |
| 5,647,942 A | 7/1997 | Haji | 156/281 |
| 5,660,744 A * | 8/1997 | Sekine et al. | 219/121.43 |
| 5,707,485 A | 1/1998 | Rolfson et al. | 156/643.1 |
| 5,710,407 A * | 1/1998 | Moore et al. | 219/405 |
| 5,767,008 A | 6/1998 | Haji | 438/612 |
| 5,779,807 A | 7/1998 | Dornfest et al. | 134/1.2 |
| 5,823,416 A | 10/1998 | Haji | 228/4.5 |
| 5,919,332 A * | 7/1999 | Koshiishi et al. | 156/345.47 |
| 5,958,510 A | 9/1999 | Sivaramakrishnam et al. | 427/255.6 |
| 5,972,163 A | 10/1999 | Haji | 156/345 |
| 6,035,804 A * | 3/2000 | Arami et al. | 118/723 E |
| 6,050,216 A * | 4/2000 | Szapucki et al. | 118/723 E |
| 6,050,446 A * | 4/2000 | Lei et al. | 220/819 |
| 6,093,904 A | 7/2000 | Haji | 219/121.46 |
| 6,129,808 A * | 10/2000 | Wicker et al. | 156/345.1 |
| 6,267,074 B1 * | 7/2001 | Okumura | 118/723 MP |
| 6,331,347 B2 | 12/2001 | Haji | 428/209 |
| 6,352,593 B1 * | 3/2002 | Brors et al. | 118/724 |

FOREIGN PATENT DOCUMENTS

| | | | | |
|---|---|---|---|---|
| JP | 59-164696 | | 9/1984 | |
| JP | 60202937 A | * | 10/1985 | H01L 21/302 |
| JP | 03-023137 | | 1/1991 | |
| JP | 03002377 A | * | 1/1991 | C23C 16/50 |
| JP | 03-159143 | | 7/1991 | |
| JP | 04-123430 | | 4/1992 | |
| JP | 04-311044 | | 11/1992 | |
| JP | 6-21032 | | 1/1994 | |
| JP | 2828066 | | 9/1998 | |

OTHER PUBLICATIONS

Panasonic Factory Automation Company, Japanese Brochure, Nov. 2000.

March Instruments, Inc., *In-Line Plasma System*, Brochure, Aug. 1995.

March Instruments, Inc., *TAC Technology Advancement Center*, Brochure, Feb. 1995.

Materials Research Corporation, *1.12 Inline production magnetron sputtering*, Journal Article, 3 pages.

Von Dr.-Ing M. Nowottnick, Fraunhofer-Einrichtung fur Zuverlassigkeit und Mikrointegration (IZM), Berlin, *Plasmabehandlung als umweltfreundliche Alternative in der Leiterplattenfertigung*, Galvanotechnik D-88348 Saulgau 86 (1995) Nr. 4; Journal Article, 6 pages.

* cited by examiner

HIGH-SPEED SYMMETRICAL PLASMA TREATMENT SYSTEM

This application claims benefit of Provisional 60/143,577 filed Jul. 13, 1999.

FIELD OF THE INVENTION

The present invention relates generally to plasma processing, and more particularly to a plasma treatment system configured to enhance plasma uniformity and to increase process throughput.

BACKGROUND OF THE INVENTION

Plasma treatment is commonly applied for modifying the surface properties of workpieces used in applications relating to integrated circuits, electronic packages, and printed circuit boards. Plasma treatment systems are configured to produce a plasma from a process gas and directly bombard the surface of a substrate or workpiece with energetic ions from the gas plasma to remove surface atoms by physical sputtering or chemically-assisted sputtering. Ion bombardment may be used to condition the surface to improve properties such as adhesion, to selectively remove an extraneous surface layer of a process material, or to clean undesired contaminants from the surface. Plasma treatment is used in electronics packaging, for example, to increase surface activation and/or surface cleanliness for eliminating delamination and bond failures, improving wire bond strength, ensuring void free underfill, removing oxides, increasing die attach, and improving adhesion for encapsulation.

The number of impinging ions per unit area, or ion flux, must be precisely and accurately controlled at all positions on the surface of the workpiece so that the time-integrated ion flux is substantially uniform across the surface. Critical parameters for controlling the uniformity of the ion flux include the spatial uniformity of the excitation power and the dispersion of the process gas. A non-uniform ion flux degrades process reliability and reduces the process yield.

Plasma treatment systems may be integrated into in-line and cluster systems or batch processes in which groups of workpieces are processed by successive plasma exposures or processing cycles. Workpieces may be supplied within a magazine, individually by a conveyer transport system, or manually. Plasma treatment systems may be provided with automated robotic manipulators that coordinate workpiece exchange for plasma processing operations.

Conventional plasma treatment systems have failed to provide adequate process uniformity across the surface of individual workpieces. To achieve workpiece-to-workpiece uniformity, the process gas must be evenly dispersed and uniformly ionized by the excitation power so that the ion flux is spatially uniform across the surface of the workpiece. Conventional plasma treatment systems have likewise failed to achieve adequate reproducibility of the plasma treatment between successive batches of workpieces. Batch-to-batch reproducibility depends on the precise control of process variables and parameters so that successive workpieces are exposed to substantially identical plasma conditions. Moreover, conventional plasma treatment systems are incapable of rapidly processing workpieces with a throughput amenable to automated process lines or fabrication requirements. System throughput and uniformity of the plasma treatment must be maximized for reducing production costs.

There is thus a need for a plasma treatment system that can provide a plasma having a uniform density adjacent all points of a surface of a workpiece and that can consistently reproduce that uniformly dense plasma for sequentially processing a series of workpieces.

SUMMARY

The present invention addresses these and other problems associated with the prior art by providing a plasma treatment system having a processing chamber interfaced with and controlled by a programmable logic control system. The system includes a vacuum chamber having a processing space that surrounds a workpiece-holding portion, which is configured to receive and support the workpiece. Process gas is provided to the processing space and actively pumped through a vacuum port by a vacuum pump. A vacuum distribution baffle provides a uniform flow of process gas adjacent over the workpiece to the vacuum port, while simultaneously affording a high pumping rate for rapidly evacuating the processing chamber. A powered electrode, positioned between the vacuum distribution baffle and the workpiece holding portion and in electrical continuity with the workpiece holding portion, is operably connected to a plasma excitation source for generating a plasma from the process gas.

In an aspect of this invention, the vacuum distribution baffle may be composed of a ceramic and serve as a shield for reducing the plasma excitation power required to generate a plasma in the processing chamber. The baffle confines the plasma to a portion of the processing space adjacent the powered electrode and workpiece.

In another aspect of this invention, the workpiece holding portion is configured to position the workpiece equidistantly between the powered electrode and the ground electrode. The symmetrical placement contributes to producing a substantially perpendicular electrical field between the electrodes and, thereby, contributing to a highly uniform and symmetrical distribution of plasma density adjacent the workpiece.

In another aspect of this invention, the chamber lid of the vacuum chamber features a gas distribution system that includes a process gas inlet port for introducing a process gas into a gas distribution space embedded in the chamber lid. An array of apertures is provided on the interior face of the lid and are arranged to provide a symmetrical and uniform flow of a process gas in two dimensions over the surface of the workpiece held by the workpiece holding portion. When the process gas is ionized by a plasma excitation source, the uniform flow contributes to a uniform plasma density.

In another aspect of this invention, the hinge that couples the chamber base and the chamber lid, or access member, includes an obround bearing groove for receiving a hinge pin. The obround bearing groove accommodates a substantially vertical compression of the sealing member or O-ring between the access member and the base when a vacuum pressure exists within the processing chamber. By constraining lateral movement between the lid and base, abrasion of the surface of the sealing member is significantly reduced and the lifetime of the sealing member is substantially extended. Further, the lid and base are uniformly sealed along all points of contact with the sealing member due to the uniform substantially vertical compression.

In one embodiment, the plasma treatment system may include a variable position workpiece holding portion with moveable holding structure. By simply repositioning the holding structure, the system can be rapidly reconfigured to adapt to changes in workpiece dimension.

In another embodiment, the invention provides a plasma processing system in which a workpiece to be processed is transferred into a processing chamber. The pressure within the processing chamber is reduced, and flows of process gases are initiated into the processing chamber. A first lower magnitude of RF power is applied to electrodes within the processing chamber to create a gas plasma and initiate a plasma treatment cycle. An impedance of an RF system including the electrodes is matched to a desired impedance at the first RF power magnitude. While increasing the RF power to the electrodes, the impedance of the RF system including the electrodes is matched to the desired impedance. After an end of the plasma processing cycle is detected, the flow of process gases to the processing chamber and the application of RF power to the electrodes are terminated.

In one aspect of this invention, the decrease in pressure in the processing chamber and the flow of process gases into the processing chamber occur simultaneously. In another aspect of this invention, RF power to the electrodes is increased at the highest rate at which the impedance of the RF system can be continuously matched to the desired impedance. In a still further aspect of this invention, the RF power to the electrodes is decreased after detecting the end of the processing cycle.

In a still further embodiment, the invention provides a plasma processing system in which a workpiece to be processed is transferred into a processing chamber. The pressure within the processing chamber is reduced to a first pressure value, and flows of process gases are initiated into the processing chamber. RF power is applied to electrodes within the processing chamber to create a gas plasma and initiate a plasma processing cycle, and an impedance of an RF system including the electrodes is matched to a desired impedance at the first RF power magnitude. Evacuation of the processing chamber continues over the plasma processing cycle. After an end of the plasma processing cycle is detected, the flow of process gases and the application of RF power to the electrodes are terminated.

In an aspect of this invention, pressure within the processing chamber is allowed to vary between upper and lower boundary pressure limits. The upper pressure limit is determined by adding an incremental pressure value to normally used pressure value, and the lower pressure limit is determined by subtracting the incremental pressure value from the normally used pressure value.

These and other objects and advantages of the present invention shall become more apparent from the accompanying drawings and description thereof.

BRIEF DESCRIPTION OF THE FIGURES

The accompanying drawings, which are incorporated in and constitute a part of this specification, illustrate embodiments of the invention and, together with a general description of the invention given above, and the detailed description given below, serve to explain the principles of the invention.

DETAILED DESCRIPTION OF THE INVENTION

The present invention, in accordance with the principles and objectives herein, provides an apparatus and a method for processing a workpiece with a plasma. The present invention provides a plasma treatment system configured to provide a uniformly dense plasma, rapid pump-down and venting cycles, reproducible processing conditions, and simplified material handling. The system advantageously requires a reduced excitation power to initiate and sustain a uniformly dense plasma in the processing space, while employing a control algorithm that minimizes the cycle time required to process each successive workpiece.

Figure 1:
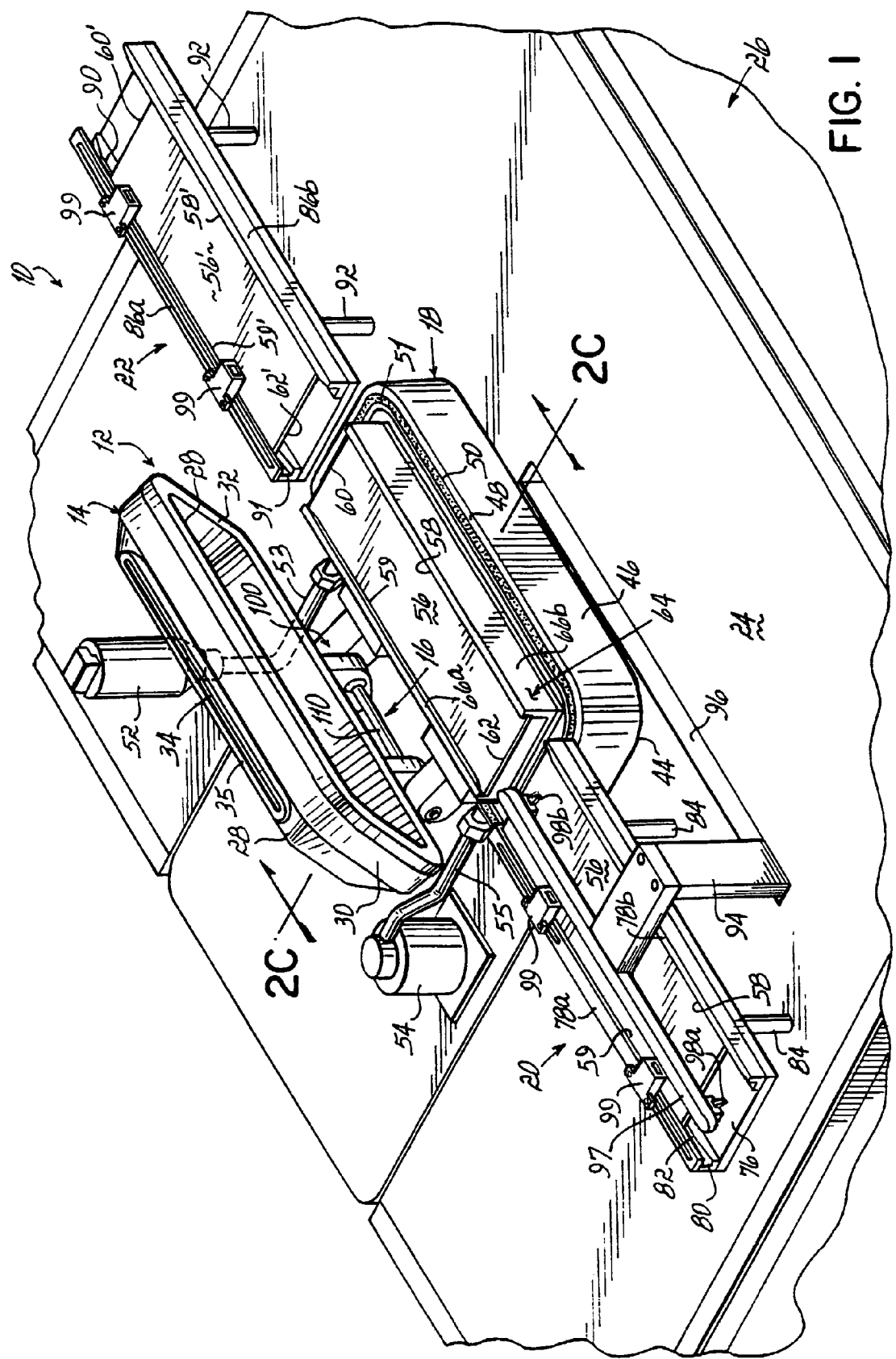
FIG. 1 is a perspective view of a plasma treatment system in accordance with the principles of the present invention.
Figure 2A:
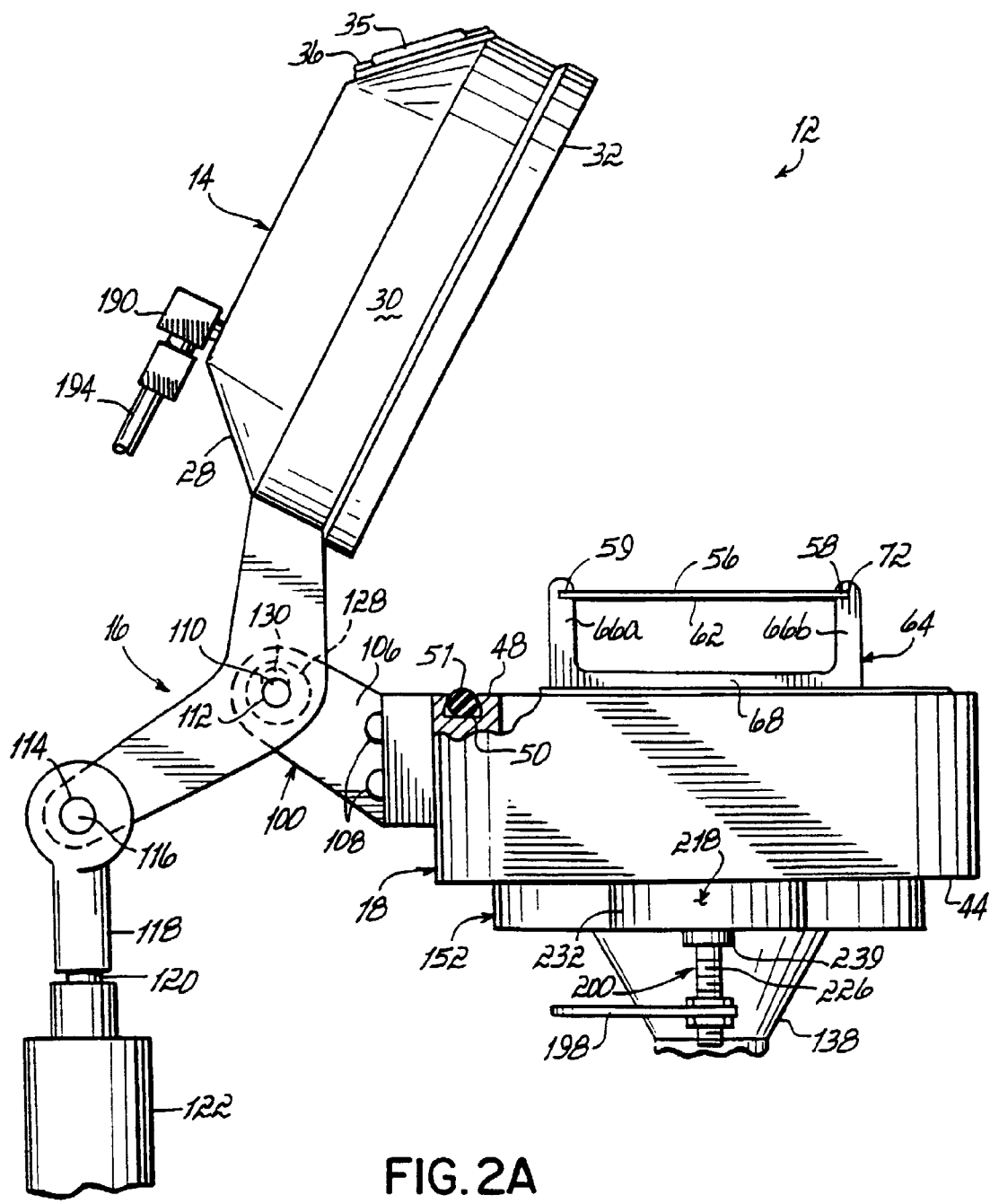
FIG. 2A is a side schematic and partially broken view of the plasma treatment system of FIG. 1.
Figure 2B:
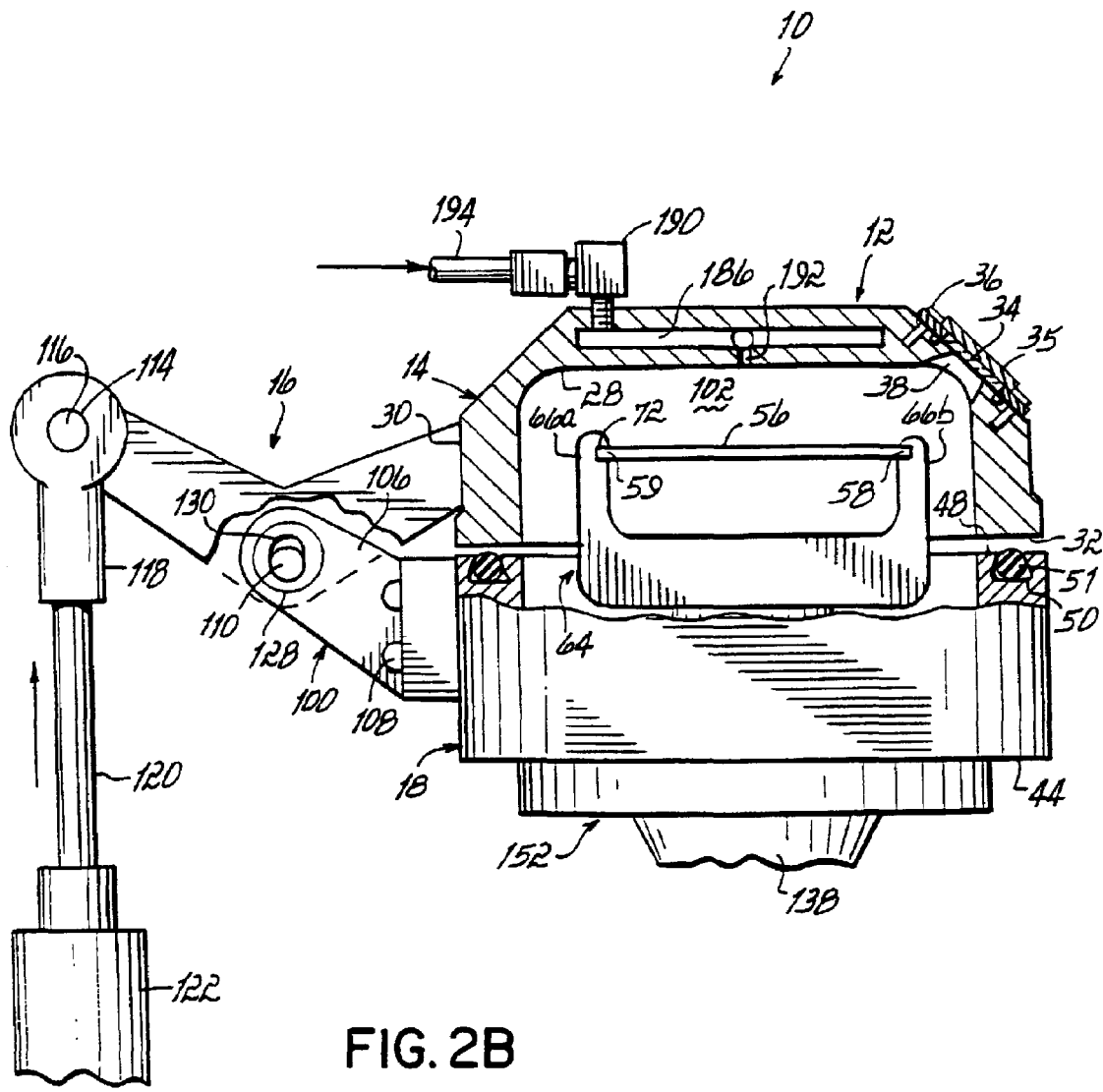
FIG. 2B is a side schematic and partially broken view of the plasma treatment system of FIG. 1 in which the chamber lid is in a closed position.

A plasma treatment system 10, in accordance with the principles of the present invention, is illustrated in FIGS. 1, 2A–2C and 3. Referring to FIG. 1, plasma treatment system 10 includes a processing chamber 12, a loading station 20, and an exit station 22, which are situated on a substantially flat and mechanically stable surface 24 atop an instrument cabinet 26. Processing chamber 12 includes a chamber lid 14 hingeably connected to a chamber base 18 by a hinge assembly 16. Chamber lid 14 is selectively positionable between an open position, as shown in FIGS. 1 and 2A, and a closed position, as shown in FIG. 2B. Chamber base 18 and chamber lid 14 are preferably formed of an electrically conductive material suitable for high-vacuum applications, such as an aluminum alloy or a stainless steel.

Figure 2C:
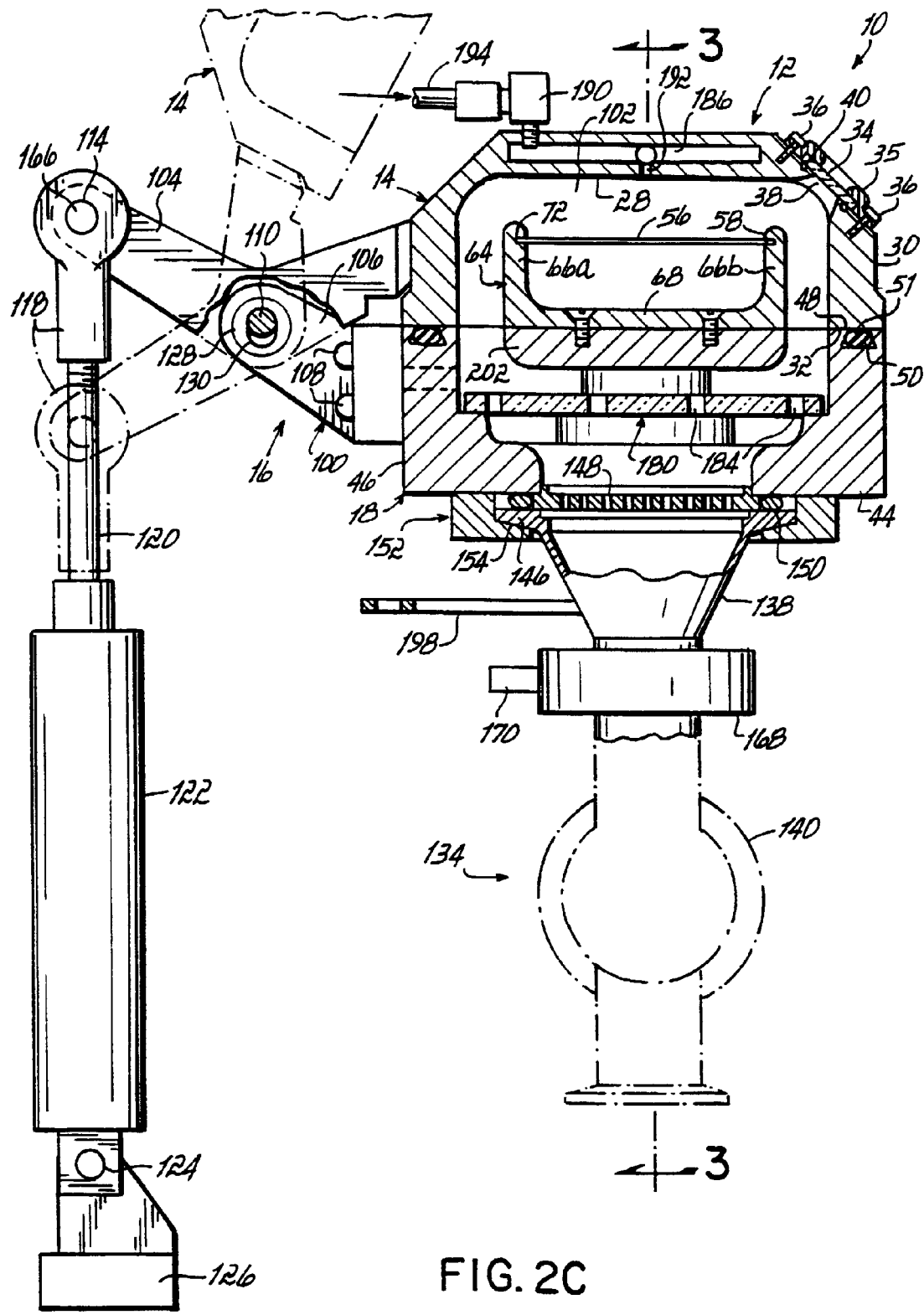
FIG. 2C is a detailed side view of the plasma treatment system of FIG. 1.

Chamber lid 14 includes a domed ceiling 28 and an integral sidewall 30 encircled by a flat rim 32. A viewport opening 38 is provided in ceiling 28 for holding a viewport 34. As best shown in FIG. 2C, viewport 34 is a substantially planar panel attached to chamber lid 14 by a frame 35 and fasteners 36. An O-ring 40 is received within a groove 42 that circumscribes viewport opening 38. Viewport 34 compressively engages O-ring 40 to create a vacuum-tight seal, where the sealing force is supplied by the pressure differential between the interior and exterior of processing chamber 12 and fasteners 36. Viewport 34 is constructed of a dielectric ceramic, such as quartz or alumina, that has a low sputtering coefficient, is gas impermeable, and has a wide transmission range for optical wavelengths. O-ring 40 is preferably formed of an elastomer such as Viton®.

Chamber base 18 includes a floor wall 44 integral with a sidewall 46 which is encircled by a flat lip 48. Lip 48 includes a circumferential groove 50 for receiving a conductive resilient sealing member or O-ring 51 that provides an electrically-conductive pathway and a substantially vacuum-tight seal between chamber lid 14 and chamber base 18. The dimensions of groove 50 and O-ring 51 are selected for creating a vacuum-tight seal. It may be appreciated that O-ring groove 50, and therefore O-ring 51, may be positioned in either chamber lid 14 or chamber base 18 without departing from the spirit and scope of the present invention. Particulates from the surrounding environment are less likely to attach to, and compromise the sealing ability of, O-ring 51 if positioned in chamber lid 14.

O-ring 51 is a conductive elastomer gasket, preferably formed of a composite of a conductive fill powder impregnated in an elastomer binder, such as a powder of silver and aluminum in silicone. An exemplary O-ring 51 is formed of a conductive composite manufactured and marketed under the trade name Cho-seal® by EMI Shielding Products, a division of Parker Hannifin Corp. (Cleveland, Ohio).

In another aspect, chamber base 18 further includes a workpiece holding portion or substrate support 64 configured to receive and support a part or workpiece 56. Generally, workpiece 56 is a rectangular, planar structure that includes a periphery having opposed side edges 58, 59 of a predetermined thickness, a leading edge 60, and a trailing edge 62. Opposed side edges 58, 59 are separated by a predetermined maximum transverse width that is measured perpendicular to a longitudinal axis of workpiece 56. Workpiece 56 may be a strip type part, such as a ball grid array (BGA) or a metal lead frame, singulated BGA's carried in an Auer boat, or a pallet carrying multi-chip electronic modules, integrated circuit chips, or the like.

Figure 3:
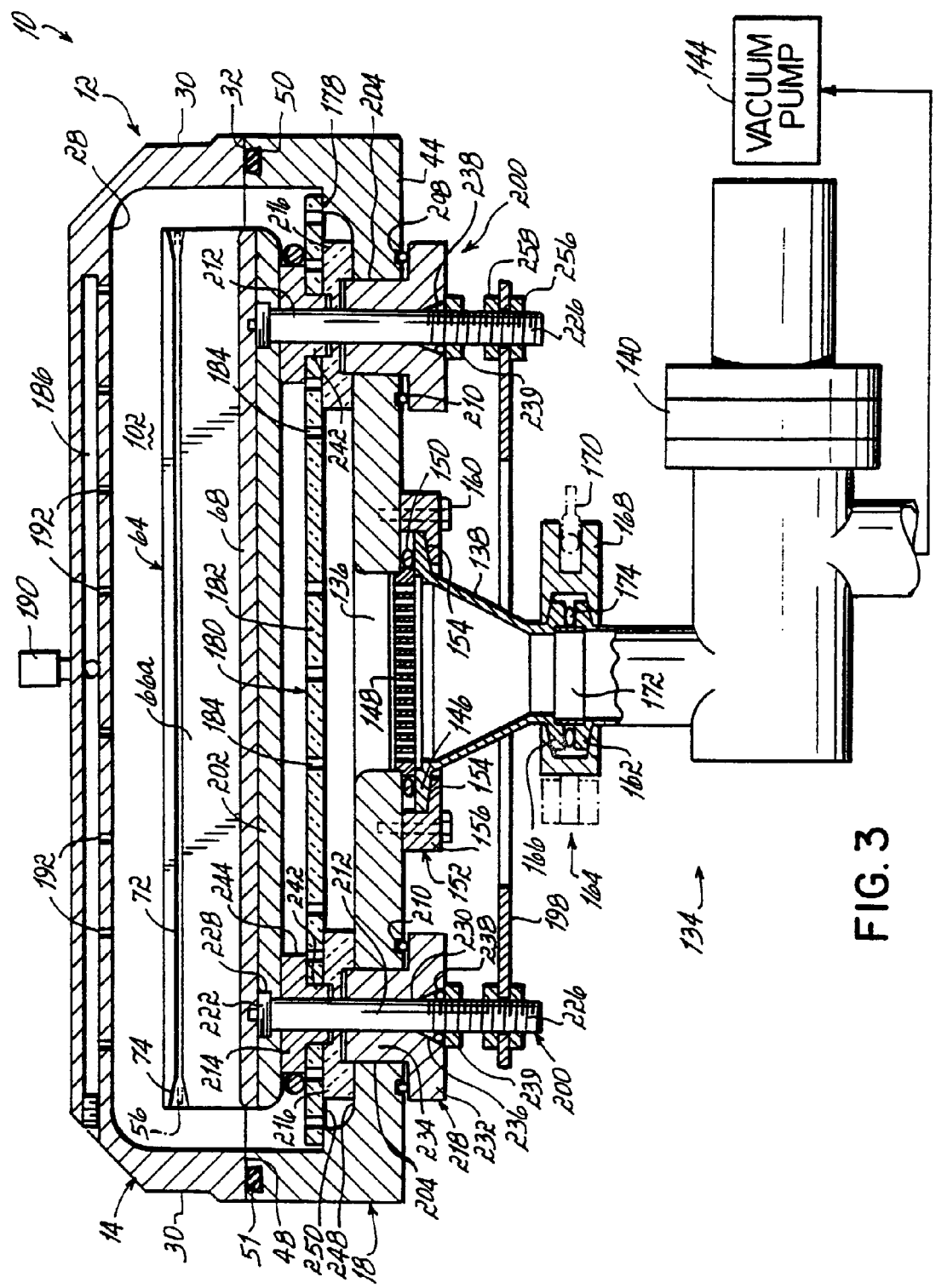
FIG. 3 is a front view of the plasma treatment system of FIG. 1.

As best depicted in FIG. 2C, substrate support 64 comprises opposed side rails 66a, 66b that extend vertically from a substantially planar support platform 68. Side rail 66a is in a spaced relationship relative to side rail 66b along the longitudinal axis of support platform 68 so that the maximum width between side edges 58 and 59 of workpiece 56 may be accommodated. For convenience, side rail 66a will be detailed below with the understanding that side rail 66b has an identical structure. Side rail 66a protrudes above a horizontal plane that includes lip 48 and incorporates an elongate channel 72, as best shown in FIG. 3, that extends parallel to a longitudinal axis of substrate support 64. Channel 72 has a U-shaped cross-sectional profile that is dimensioned to slidingly receive side edge 59 of workpiece 56 therein. Opposed extremities of channel 72 include a flared lip 74, as best shown in FIG. 3, that physically captures side edge 59 of workpiece 56 during loading. By way of example and not limitation, substrate support 64 may be configured to accept workpieces 56 having maximum dimensions of 2.7" (wide)×9.25" (long)×3/8" (thick) or maximum dimensions of 6"×12"×1".

Referring to FIG. 1, loading station 20 and exit station 22 are proximate to respective opposed ends of processing chamber 12 and are adapted for shuttling workpieces 56, 56' into and out of processing chamber 12. Loading station 20 includes a substantially planar support platform 76 and opposed loading side rails 78a and 78. Loading side rail 78a is in a spaced relationship relative to loading side rail 78b along the longitudinal axis of support platform 76 so that the maximum width of workpiece 56 may be accommodated. For convenience, side rail 78a will be detailed below with the understanding that side rail 78b is substantially identical. Loading side rail 78a protrudes above a horizontal plane that includes lip 48 and incorporates an elongate channel 82. Channel 82 has a U-shaped cross-sectional profile that is dimensionally adapted to slideably receive one opposed side edge 58 or 59 of workpiece 56 therein. Opposed extremities of channel 82 include a flared lip 80 that physically captures the side edges 58, 59 of workpiece 56. Support posts 84 extend from a bottom surface of the support platform 76 to surface 24.

Exit station 22 is configured similarly to loading station 20. Exit station 22 includes opposed unloading side rails 86a, 86b that extend upwardly and outwardly from a planar support platform 88. For convenience, side rail 86a will be detailed below with the understanding that side rail 86b has an identical structure. Side rail 86a protrudes above a horizontal plane that includes rim 48 and incorporates a longitudinal channel 90. Channel 90 has a U-shaped cross-sectional profile that is dimensioned to slideably receive one of the two peripheral edge 58', 59' of processed workpiece 56' therein. Opposed extremities of channel 90 include a flared lip 91 that aids in physically capturing the side edges 58', 59' of processed workpiece 56' during unloading. Support posts 92 extend from a bottom surface of support platform 88 to surface 24.

Plasma treatment system 10 further includes pinch wheels 99 attached to loading station 20 and exit station 22 and a positioning lever 94. Pinch wheels 99 are operable to make fine adjustments in the positioning of workpiece 56 or workpiece 56'. Lever 94 is operable to move along the length of a slot 96 defined in the top surface 24 of instrument cabinet 26 and to also translate vertically. A driving mechanism (not shown) is attached to lever 94 and is operable to move arm 94 vertically and longitudinally in slot 96. Lever 94 is positioned entirely outside of processing chamber 12 during a plasma processing cycle.

Positioning lever 94 further includes a rod 97 having a first finger 98a that selectively abuts a rear edge 62 of workpiece 56 held between loading side rails 78a,b and a second finger 98b that selectively abuts a rear edge 62 of second workpiece 56 held between sides rails 66a,b. It may be appreciated that fingers 98a,b can be resiliently biased relative to rod 97 and, in addition, that fingers 98a,b may further include a sensor for detecting resistance in the linear movement of positioning lever 94 due to, for example, a workpiece misaligned with a set of side rails.

During a workpiece loading operation, workpiece 56 is delivered by an automated conveying system (not shown) and positioned in loading side rails 78a,b on loading station 20. Pinch wheels 99 of loading station 20 are used to move the workpiece 56 short distances for proper positioning. After chamber lid 14 is opened, positioning lever 94 is lowered from its initial position and linearly actuated so that finger 98a will engage rear edge 62 and push workpiece 56 along loading side rails 78a,b toward substrate support 64. The front edge 60 of workpiece 56 will traverse the gap between loading side rails 78a,b and side rails 66a,b. Opposed side edges 58, 59 of workpiece 56 will be slideably received by side rails 66a,b. Thereafter, the positioning lever 94 will continue to push the workpiece 56 until it is suitably and accurately positioned on substrate support 64. Preferably, the center of workpiece 56 is positioned coaxial with the central vertical axis or centerline of the processing chamber 12. Positioning lever 94 then translates vertically so that finger 98b will clear the leading edge of workpiece 56 as lever 94 is retracted to its initial position.

If processed workpiece 56' resides on substrate support 64 during the workplace loading operation, finger 98b engages rear edge 62' and positioning lever 94 sweeps the processed workpiece 56' toward exit station 22. Front edge 60' of processed workpiece 56' will cross the gap between the processing chamber 12 and exit station 22. Side edges 58', 59' of processed workpiece 56' are captured by unloading side rails 86a,b. With continued linear movement, processed workpiece 56' is completely removed from processing chamber 12. Pinch wheels 99 of exit station 22 are used to move the workpiece 56' short distances for proper positioning in preparation for transport to the next processing station.

Hinge assembly 16 is adapted so that chamber lid 14 may be selectively pivoted relative to chamber base 18 between an open position, as best illustrated in FIG. 2A, and a closed position, as best illustrated in FIG. 2B. Hinge assembly 16 includes at least two brackets 100, as best shown in FIG. 1, that are disposed in a spaced relationship along the non-vacuum side of sidewall 46. When chamber lid 14 is cantilevered into a closed position, chamber lid 14 and chamber base 18 bound a vacuum-tight processing space 102, as shown for example in FIG. 2B.

Each bracket 100 includes a V-shaped brace 104 and a nub 106 mounted with fasteners 108 to a non-vacuum side of sidewall 46. Each brace 104 is carried by a hinge pin 110 received within an aperture 112 near the bend in brace 104 and within a coaxial aperture 124 in nub 106. As shown in FIG. 1, hinge pin 110 is shared by both brackets 100. Returning to FIG. 2A, one end of brace 104 is connected to the non-vacuum side of sidewall 30 of chamber lid 14. A second end of each brace 104 includes an aperture 114 that receives a connecting rod 116 that is also shared by both braces 104.

Connecting rod 116 is further attached to a rod end 118 that is threadingly carried by one end of a piston rod 120 of a bi-directional pneumatic cylinder or lid actuator 122. Rod end 118 further includes an aperture (not shown but similar to, and collinear with, aperture 114) with an inner diameter sized to slideably receive connecting rod 116 therein. Piston rod 120 is adapted for reciprocating linear, vertical motion so that brace 104 can pivot about hinge pin 110 to cantilever chamber lid 14 between an open position and a closed position. As shown in FIG. 2C, the opposed end of lid actuator 122 is affixed via a mounting block 126 to a structural support (not shown) within instrument cabinet 26.

Referring to FIG. 2B, in one aspect of the present invention, an obround bearing 128 is slidingly received within aperture 124 of nub 106. Obround bearing 128 has an exterior, annular surface of an outer diameter chosen to frictionally fit within aperture 124 and an interior bore 130 that is dimensioned to receive hinge pin 110. Bore 130 has a substantially oval cross-sectional profile with a vertical major axis, as viewed normal to the longitudinal axis of bore 130. When chamber lid 14 is in an open position, as shown in FIG. 2B, a length of one end of hinge pin 110 will contact a lower interior surface of bore 130. As chamber lid 14 is pivoted by the lid actuator 122, hinge pin 110 rotates about a longitudinal axis thereof. During rotation, the outer surface of hinge pin 110 remains in contact with the lower interior surface of bore 130. When lip 32 contacts the surface of O-ring 51, as shown in FIG. 2B, lid actuator 122 will continue to extend so that the chamber lid 14 moves downward to compress O-ring 51. Due to the presence of obround bearing 128, hinge pin 110 is free to translate vertically upward in bore 130.

Referring to FIG. 2C, in which the chamber lid 14 resides in a closed position, the interior peripheral surface of the chamber lid 14 and chamber base 18 bounds processing space 102. The vacuum seal is enhanced by the further compression of O-ring 51 between chamber base 18 and chamber lid 14. The additional compression of O-ring 51 results from the pressure differential between atmospheric pressure acting on the exterior of chamber lid 14 and the vacuum within processing chamber 12 that applies a force that urges chamber lid 14 vertically downward towards chamber base 18. Hinge pin 110 translates vertically and with minimal transverse motion due to the presence of obround bearing 128.

Bore 130 within obround bearing 128 affords an additional degree of vertical freedom for hinge pin 110, as compared with a conventional bearing having a bore of a circular cross-sectional profile. Chamber lid 14 is free to move vertically in response to the forces that compress O-ring 51. As a result, the vacuum-tight seal between lip 32 and O-ring 51 is uniform about the circumference of groove 50. In a preferred embodiment, the presence of obround bearing 128 provides approximately 50 mils of vertical movement for hinge pin 110.

A pressure gauge 52 is connected via tubing 53 to an opening provided in sidewall 46. Pressure gauge 52 is operable to sense the vacuum pressure within processing space 102 and provides a pressure feedback signal. An exemplary pressure gauge 52 is a capacitance manometer, such as the Baratron® Capacitance Manometer manufactured by MKS Instruments (Andover, Mass.). A bleed valve 54 is connected via tubing 55 to another opening provided in sidewall 46. Bleed valve 54 is operable to vent processing chamber 12 with ambient air or a supplied gas, such as nitrogen.

Referring to FIG. 3, plasma treatment system 10 is connected for fluid communication with a vacuum pumping system 134 through a large, centrally located exhaust port 136 in bottom wall 44 of chamber base 18. Vacuum pumping system 134 includes a conical reducing nipple 138, a vacuum valve 140, an exhaust vacuum conduit (not shown), and a vacuum pump 144.

Opposing ends of conical reducing nipple 138 carry a first vacuum flange 146 and a second vacuum flange 166. First vacuum flange 146 is connected to exhaust port 136 via a screened centering ring 148 circumscribed by O-ring 150 and a plurality of bulkhead clamps 152. Bulkhead clamps 152 are symmetrically disposed about the periphery of first vacuum flange 146. Each bulkhead clamp 152 has a tapered segment 154 that is adapted to engage a complementary lower surface of first vacuum flange 146 and a block portion 156 that further includes bores (not shown) for removably receiving fasteners 160. Preferably, fasteners 160 are threaded bolts attachable to openings having complementary internal threads (not shown) in bottom wall 44. To create a vacuum-tight seal, fasteners 160 are tightened to a preselected torque in a patterned sequence so as to uniformly compress O-ring 150.

Vacuum valve 140 carries an upper vacuum flange 162 connected for fluid communication via a vacuum fixture 164 with second vacuum flange 166 which is carried by conical reducing nipple 138. Vacuum fixture 164 comprises a removable clamshell clamp 168 with a wingnut closure 170 and a through-bore centering ring 172. When wingnut closure 170 is tightened, an O-ring 174 carried by centering ring 172 is compressed to created a vacuum-tight seal. Vacuum valve 140 also is further connected for fluid communication with vacuum pump 144.

Vacuum pump 144 may comprise one or more vacuum pumps as would be apparent to one of ordinary skill in the art of vacuum technology. A preferred vacuum pump 144 is a single rotary-vane vacuum pump of the type manufactured by, for example, Alcatel Vacuum Technologies Inc. (Fremont, Calif.), that has a pumping rate of about eleven cubic feet per minute and which, due to the high conductance of processing chamber 12, can evacuate processing space 102 to a vacuum pressure of about 200 mTorr in less than about six seconds. Alternative vacuum pumps 144 include dry pumps and turbomolecular pumps.

In another aspect of the present invention, a vacuum distribution baffle 180 is positioned on a shoulder 178 on the interior of chamber base 18. Vacuum distribution baffle 180 is a flat elongate plate 182 perforated by a plurality of orifices 184. Orifices 184 restrict the flow of process gas toward the inlet of vacuum pumping system 134 so as to divert the pressure differential. As a result, the entire processed surface of workpiece 56 will be uniformly exposed to the plasma while simultaneously allowing high-speed evacuation of process gas and sputtered contaminant species during a plasma processing operation. Vacuum distribution baffle 180 also prevents gas flow to vacuum pump 144 from disturbing the position of workpiece 56 upon substrate support 64.

Preferably, vacuum distribution baffle 180 is formed of an electrically-insulating material, such as a machinable ceramic, having a minimal out-gassing potential. Suitable machinable ceramics include an aluminum oxide or a glass-bonded mica composite, such as Mykroy/Mycalex® or Macor®.

In one aspect of the present invention, chamber lid 14 integrates a gas distribution system that is configured to symmetrically and evenly distribute the flowing stream of process gas over the surface of workpiece 56. Specifically, ceiling 28 of chamber lid 14 includes an embedded cavity 186, a process gas inlet port 190, and a plurality of apertures 192. As best shown in FIG. 2C, gas inlet port 190 is positioned in chamber lid 14 and is coupled via gas line 194 to a gas manifold 308 (FIG. 4) for providing a process gas to processing space 102. As best shown in FIG. 3, the vacuum side of ceiling 28 includes apertures 192 for injecting process gas from cavity 186 into processing space 102. Preferably, apertures 192 are symmetrically distributed in a two dimensional array about the longitudinal axis of processing chamber 12 so that process gas will flow uniformly over the surface of workpiece 56, and therefore, contribute to improving plasma uniformity.

In another aspect, chamber base 18 further includes a power distribution system that transfers electrical power from a plasma excitation source, such as radio-frequency (RF) generator 302 (FIG. 4), to ionize the process gas confined within processing space 102. The power distribution system includes a power distribution bar 198 operably connected to the RF generator 302, a pair of power feedthroughs 200, a bottom electrode 202, and substrate support 64. The RF generator 302 is operably connected by feedthroughs 200 to the substrate support 64, which serves as a powered electrode for capacitively coupling excitation energy with the process gas in processing chamber 12 to initiate and sustain a plasma in processing space 102. Chamber lid 14 and chamber base 18 collectively form an unpowered, ground electrode.

Floor wall 44 of chamber base 18 further includes two openings 204 that receive power feedthroughs 200. A circular groove 208 is concentrically disposed about the central, longitudinal axis of each opening 204 for receiving an O-ring 210 therein. Power feedthrough 200 includes an electrical tie rod 212 coaxially surrounded by a shield insulator washer 214, a chamber insulator washer 216, and a bottom insulator washer 218. Preferably, washers 214, 216, 218 are composed of a gas-impermeable ceramic dielectric, such as quartz or alumina, and each tie rod is formed of an electrical conductor, such as copper, aluminum, or alloys thereof. Power feedthrough 200 is electrically isolated from processing chamber 12.

Electrical tie rod 212 includes a flanged head 222 and an opposed threaded end 226. Flanged head 222 is received within a complementary recess 228 disposed in the upper surface of bottom electrode 202 for electrical continuity therewith and mechanical securement to inhibit downward movement. Tie rod 212 extends downward through the central bores in shield insulator washer 214, chamber insulator washer 216, and bottom insulator washer 218. Threaded end 226 protrudes beyond bottom wall 44 for connection with the excitation power supply.

Bottom insulator washer 218 includes an annular lower portion 232 of a first outer diameter continuous with an annular upper portion 234 of a lesser second outer diameter. Upper portion 234 is received within opening 204 so that an upper surface of lower portion 232 abuts O-ring 210 for a vacuum-tight seal with the non-vacuum surface of floor wall 44. A frustoconical portion 236 of bore 230 is adapted to receive an O-ring 238. Frustoconical portion 236 is sized and configured so that O-ring 238 can be compressed via fastener 239 to provide a vacuum seal between the circumference of tie rod 212 and bottom insulator washer 218.

Shield insulator washer 214 is interposed between the lower surface of bottom electrode 202 and the upper surface of vacuum distribution baffle 180. Shield insulator washer 214 includes an annular lower portion 242 of a first diameter integral with an annular upper portion 244 of a greater second outer diameter. Upper portion 244 abuts vacuum distribution baffle 180 and lower portion 242 protrudes downward into an opening therein.

Chamber insulator washer 216 is interposed between the inner, bottom surface of the chamber base 18 and the lower surface of the vacuum distribution baffle 180. Chamber insulator washer 214 has opposed parallel surfaces 248, 250. Surface 248 includes a first recess that is adapted to fit over a length of upper portion 234 of bottom insulator washer 218. Opposed surface 250 includes a second recess of a diverse diameter that receives a length of lower portion 242 of chamber insulator washer 216.

Fastener 239 has a threaded bore adapted to mate with the threaded end 226 of tie rod 212. When fastener 239 is tightened, an upper surface of bottom insulator washer 218 compressively engages O-ring 210 and is urged upwardly thereagainst to create a vacuum-tight seal between the exterior of the chamber base 18 and bottom insulator washer 218. An upper surface of fastener 239 compressively engages O-ring 238 disposed in frustoconical taper 234 to create a vacuum-tight seal between the circumference of tie rod 212 and the inner diameter of bottom insulator washer 218.

Power distribution bar 198 is attached to threaded end 224 of tie rod 212 by two fasteners 256, 258. The top surface of bottom electrode 202 engages the lower surface of substrate support 64 in close contact so as to provide electrical continuity. Therefore, electrical power applied to the power distribution power 198 is transferred via tie rod 212 to substrate support 64, which itself functions as a portion of the powered electrode. Bottom electrode 202 and substrate support 64 are preferably formed of an electrically-conductive material, such as aluminum. In an alternative embodiment, bottom electrode 202 may be composed of a ceramic such that substrate support 64 alone constitutes the powered electrode.

Vacuum baffle 180, described in detail above, also functions as a plasma shield that reduces the RF field strength between the underside of bottom electrode 202 and chamber base 18. As a result, the plasma will be intensified near the surface of the workpiece 56 held by substrate support 64 and the power and time to perform a plasma treatment each workpiece 56 will be minimized. Further, the configuration of powered and ground electrodes produce an electric field substantially perpendicular to a workpiece 56 residing on substrate support 64 such that ion trajectories are substantially perpendicular to the surface normal of the workpiece 56.

Workpiece 56 is advantageously positioned in processing chamber 12 having a vertical position substantially in a plane half-way between the ceiling 28 of chamber lid 14 and the top surface of support platform 68. Relative to known plasma treatment systems, minimization of the volume of chamber 12 for a high pumping rate and precise positioning of workpiece 56 permit rapid plasma processing at a reduced power level.

Figure 4:
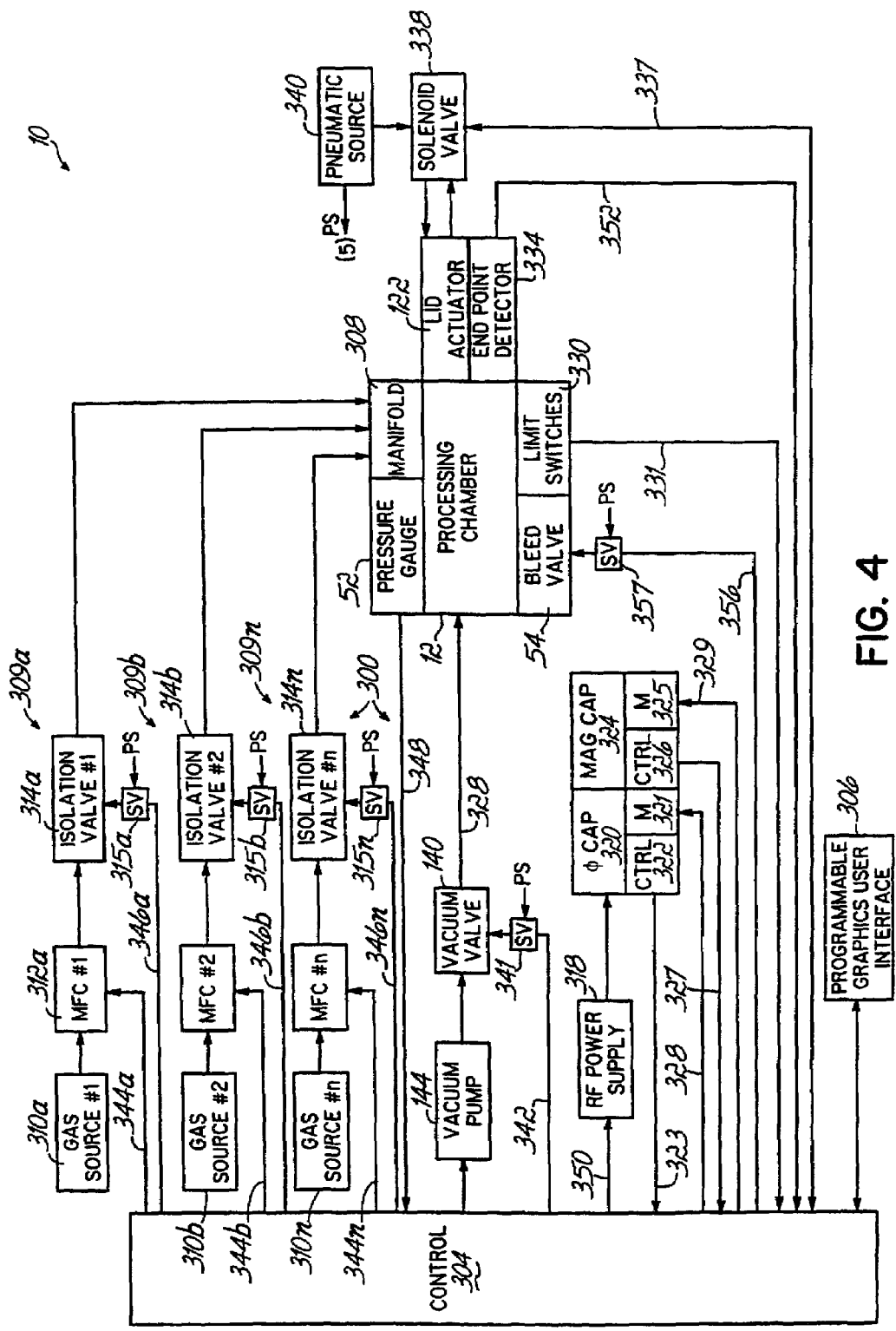
FIG. 4 is a schematic block diagram illustrating a control system for the plasma treatment system of FIG. 1.

Referring to FIG. 4, the plasma treatment system 10 includes a gas flow control 300 and an RF generator 302 connected to the processing chamber 12. A treatment system control 304 receives input signals from various devices within the plasma treatment system 10 and provides output signals to operate the gas flow control 300 and RF generator 302. The control 304 is also connected to a programmable graphics user interface 306. The interface provides user input devices, for example, pushbuttons, switches, etc., and further, has output devices, for example, lights and a display screen, thereby allowing the user to follow the status of the operation of the plasma treatment system 10 and control its operation. The control 304 may be any type of microprocessor based control having both logic and arithmetic capabilities. For example, a programmable logic controller such as Model Direct Logic 205 manufactured by Koyo and commercially available from Automation Direct of Cummings, Georgia. Further, the graphics user interface 306 is also manufactured by Koyo for the Direct Logic 205 and is also commercially available from Automation Direct.

Normally, during a plasma processing operation within the processing chamber 12, a plurality of process gases are mixed within a manifold 308. Exemplary process gases include Ar, He, $CO_2$, $N_2$, $O_2$, $CF_4$, $SF_6$, $H_2$, and mixtures thereof. Each process gas has an independent gas supply system 309 comprised of a gas source 310, a mass flow controller 312, an isolation valve 314 and a solenoid valve 315. In the example where two gases, for example, Ar and $O_2$, are used, there would be two independent gas supply systems 309$a$, 309$b$ comprised of gas sources 310$a$, 310$b$, mass flow controllers 312$a$, 312$b$, isolation valves 314$a$, 314$b$ and solenoid valves 315$a$, 315$b$. As will be appreciated, any number of additional gas supplies 309$n$ may be connected to the manifold 308 and each additional gas will have its own gas source 310$n$, mass flow controller 312$n$, isolation valve 314$n$ and solenoid valve 315$n$.

In addition to independent gas supplies, the gas flow control 300 includes vacuum pump 144, vacuum valve 140, solenoid valve 341 and pressure gauge 52. The plasma treatment system 10 is highly responsive to changes in processing parameters. Therefore, pressure gauge 52 is placed in close proximity to the chamber 12 and is fluidly connected to the chamber 12 with tube 55 of an advantageously large diameter, for example, a 0.500 inch diameter tube. The gas flow control 300 further includes bleed valve 54 and its solenoid 357 for bringing the processing chamber 12 back to atmospheric pressure at the end of a plasma processing cycle. Again, to minimize the depressurization process, bleed valve 54 is normally in close proximity to the processing chamber 12 and has a relatively large fluid communication opening therewith. Thus, the bleed valve 54 has the capability of returning the processing chamber 12 to atmospheric pressure in approximately one second.

The RF generator 302 is comprised of an RF power supply 318 providing RF power to an L-network tuner or impedance matching device 320, for example, a pair of variable air capacitors. RF power supply 302 operates at a frequency between about 40 kHz and about 13.56 MHz, preferably about 13.56 MHz, and a power between about 0 watts and about 300 watts, preferably about 60 watts to about 150 watts. RF power from the variable air capacitors 320, 324 is applied over an output 328 to substrate support 64 (FIG. 3) within the processing chamber 12. A phase capacitor 320 includes a movable plate connected to a motor 321 and further has a phase control 322 that provides an analog feedback signal on an input 323 of the control 304. A magnitude capacitor 324 has a movable plate connected to a motor 325 and further has a phase control 326 that provides an analog feedback signal on an input 327 of the control 304. The control 304 utilizes a known PID control loop to provide analog command signals on outputs 328, 329 to the respective motors 321, 325 to move the plates of the variable air capacitors 320, 324 in a known manner.

The PID control loop of the present invention utilizes a control algorithm that automatically provides a variable gain to improve performance at the boundary conditions. The magnitude of the feedback signal on the input 323 has a range of from −5 volts to +5 volts; and with a constant gain system, as the magnitude of the feedback signal moves close to and through the zero crossing, accurate and stable system control is difficult. Traditionally, the gain is set to a fixed value that is a compromise between that needed to handle lower signal levels while not letting the control system saturate at higher signal levels. The result is a generally compromised or lower level of system responsiveness and performance, that is, the time required for the control system to stabilize is longer. The present invention continuously recalculates, and dynamically sets, a gain value as a function of the signal strength of the feedback signal on the input 323. Thus, the PID loop is critically damped, that is, it reaches a stable state quickly with a minimum of overshoot. In other respects, the tuning network 320 functions in a known manner to match an impedance of an RF system comprised of an RF output of the RF power supply 318, the tuning network 320 and the RF load presented by the RF circuit within the processing chamber 12 to a desired impedance value, for example, 50 ohms.

As will be appreciated, various limit or proximity switches 330 are utilized in association with the operation of the processing chamber 12. For example, limit switches are utilized to detect the respective opened and closed positions of chamber lid 14 (FIG. 1) of the processing chamber 12 and provide a state feedback signal on a respective input 331 of the control 304. Those limit switches may be connected to the lid actuator 122 (FIG. 2C) operating the lid 14, may be mounted on the lid 14, or otherwise detect the position of the lid 14. A proximity switch is also used to detect the desired position of a workpiece 56 within the processing chamber 12. There are many different commercially available limit switch devices that utilize magnetism, mechanical contact, light, etc., to detect the proximity or position of an object. The choice of a particular type of commercially available limit switch is dependent on the application and preference of the designer.

An end point of a plasma processing cycle may be determined in several ways. The plasma treatment system of the present invention has a very high level of control; and therefore, the plasma processing cycle is highly repeatable.

Hence, with the plasma treatment system of the present invention, the control 304 normally utilizes an internal timer to measure the duration of the plasma processing cycle. In some applications, an end point detector 334 is operatively connected with the processing chamber 12. The end point detector 334 is normally a photoelectric switch that changes state in response to detecting a desired and particular wavelength of the light of the plasma generated within the processing chamber 12. Visual communication between the end point detector 334 and the interior of the processing chamber 12 may be achieved by directing the end point detector 334 through the viewport 34 (FIG. 1) or mounting the end point detector 334 within an opening or hole (not shown) in a wall of the processing chamber 12. Creation of the gas plasma within the processing chamber 12 produces light. Further, the wavelength of that light changes with the composition of the different materials within the gas plasma in the chamber 12. For example, with an etching process, as the gas plasma etches different materials from the surface of the workpiece, the wavelength of the light created by the plasma will be a function of a combination of the gas plasma and atoms of those materials. After any coatings and impurities have been etched from the surface, continued etching will result in a combination of atoms of the native material of the workpiece and the gas plasma. That combination produces a unique wavelength of light which is detected by the end point detector 334, and the detector 334 provides a binary feedback signal on an output 336 back to the control 304. Thus the control 304 is able to detect when the plasma processing cycle is completed when that feedback signal changes state.

Figure 5:
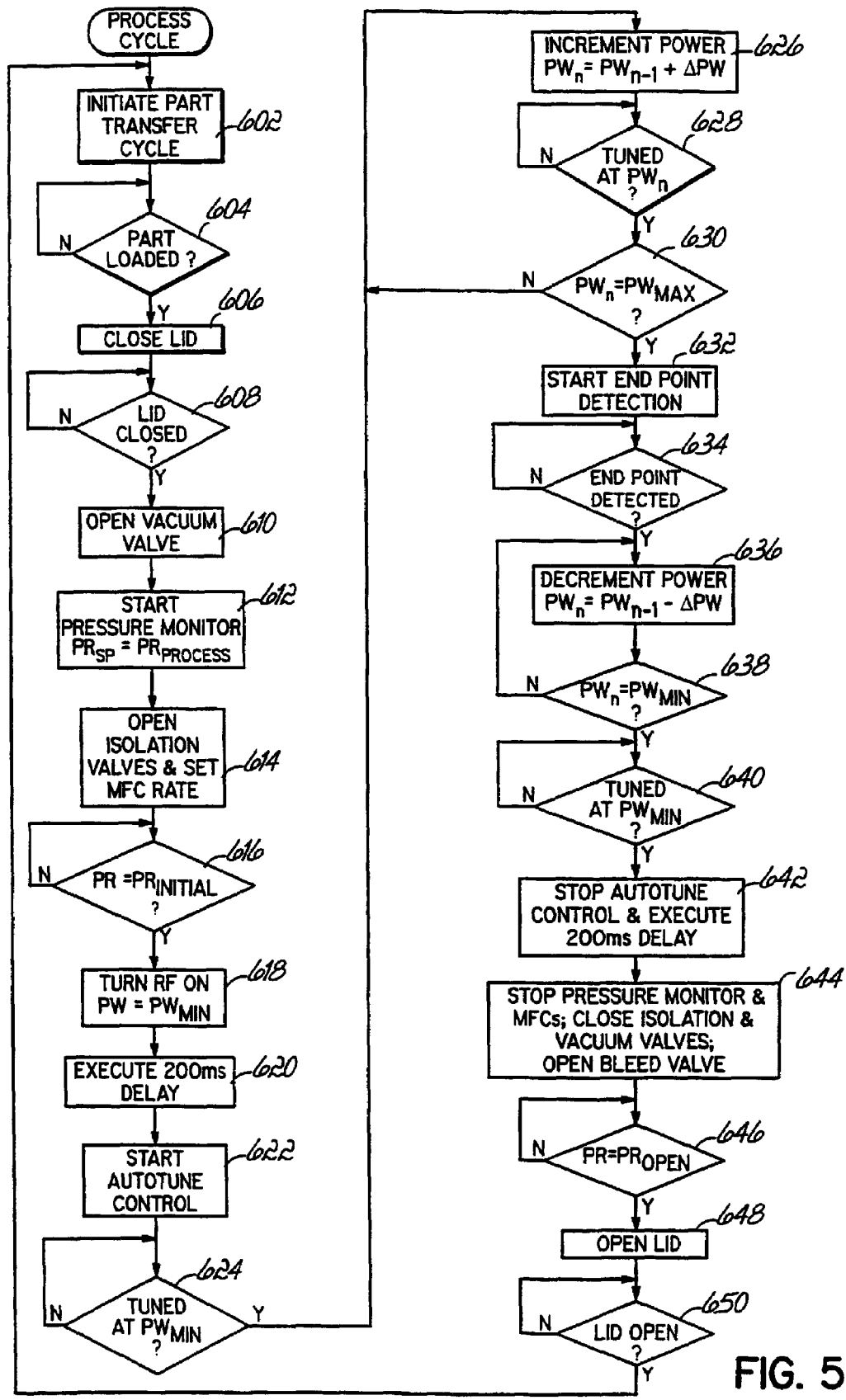
FIG. 5 is a flow chart illustrating a process of implementing a plasma processing cycle utilizing the control system of FIG. 4.

FIG. 5 is a flowchart illustrating the operation of the control 304 in implementing a typical plasma processing cycle. At 602, a part transfer cycle is initiated. During that process, the control 304 provides command signals to a controller (not shown) that causes the positioning lever 94 to move an unprocessed workpiece 56 into the chamber 12 between the side rails 78a,b. As the part 56 is moved into position, one of the limit switches 330 detects the loaded position of the part and provides a state feedback on a respective output 331 to the control 304. Upon the control, at 604, detecting a change in the switch state indicating that the part is loaded, the control 304 provides a command signal on an output 337 to open a solenoid valve 338. The open solenoid 338 directs pressurized air from a pneumatic source, for example, shop air, 340 to the lid actuator 122 in a direction causing the lid actuator 122 to move the lid 14 to its closed position. One of the limit switches 330 detects the closed position, changes state and provides a state feedback signal on a respective input 331 to the control 304.

Upon detecting the lid closed position, at 608, the control 304 then, at 610, provides a signal over an output 342 commanding the solenoid 341 to open the vacuum valve 140. Simultaneously, at 612, the control 304 establishes a pressure set point equal to $PR_{PROCESS}$ and initiates operation of a process pressure monitor. Normally, in a plasma treatment system, the chamber 12 is evacuated to a desired and fixed partial vacuum pressure prior to the start of a plasma processing cycle. However, the initial evacuation of the chamber 12 is a time consuming process. Applicants discovered that high quality plasma processing can be undertaken within a range of pressures above and below a normally used processing pressure within the chamber 12. The permissible pressure range has been determined by processing many parts under different conditions within the chamber 12. Thus, with the plasma treatment system of the present invention an upper pressure boundary limit, for example, 250 mTorr, is determined by adding an offset pressure, for example, 50 mTorr, to the normally used processing pressure, for example, 200 mTorr. Further, a lower pressure boundary limit, for example, 150 mTorr, is determined by subtracting the offset pressure, for example, 50 mTorr, from the normally used processing pressure, for example, 200 mTorr. In this example, the pressure monitor system establishes the normally used processing pressure of 200 mTorr as the pressure set point, but the pressure monitoring system will not set an alarm or otherwise impact the operation of the plasma treatment process as long as the pressure remains between the upper and lower boundary limits of 250 mtorr and 150 mtorr, respectively. Therefore, as long as the vacuum pump 144 is running, the control 304 is monitoring the input 348 which is providing a pressure feedback signal from the pressure gauge 52. When the control 304 detects that the chamber 12 is evacuated to 250 mtorr, the gas plasma is started.

Simultaneously with starting the pressure monitor at 612, the control 304, at 614, provides command signals over the outputs 344, 346 to operate respective mass flow controllers 312 and isolation valves 314. Process gas is introduced through process gas inlet port 190 at a predetermined flow rate, such as 5–100 standard cubic centimeters per minute ("sccm") for Ar. The flow rate of gas provided by the mass flow controllers 312 and the pumping rate of the vacuum pump 144 are adjusted to provide a processing pressure suitable for plasma generation so that subsequent plasma processing may be sustained. Processing pressures within the chamber 12 are typically on the order of 50 to 1000 mTorr and preferably in the range of 125 to 250 mTorr. In contrast to prior systems, the processing chamber 12 is continuously evacuated simultaneously with the introduction of the process gases which are initially used to purge ambient air from the chamber 12. In one embodiment, the mass flow controllers 312 are operated to provide a flow rate of 30 sccm to the processing chamber which has a volume of approximately 0.50 liters. Thus, fresh gases are exchanged within the processing chamber 12 approximately four times per second. More traditional plasma treatment systems exchange the gas in the processing chamber approximately once every five seconds. The higher gas flow rate of the system of the present invention improves the removal of etched materials and other contaminants from the processing chamber and also minimizes the deposition of etched materials on the walls and tooling within the chamber 12.

The control 304 continuously monitors the feedback signal on the input 348 from the pressure gauge 54 which is continuously measuring the pressure or partial vacuum within the processing chamber 12. At 616, the control 304 detects when the pressure in the processing chamber 12 is equal to an initial pressure, that is, the normally used processing pressure plus the offset pressure value, which, in the example above is 250 mTorr. The control then, at 618, provides a command signal on an output 350 to turn on the RF power supply 318. However, instead of providing full power from the RF power supply 318, the control 304 commands the RF power supply to supply only a minimum power level, for example, 30 watts. Traditional plasma treatment systems initially apply full power to the processing chamber 12 via the tuning network 320. Creating the gas plasma at full power often results in plasma spikes, electric arcs, energy hot spots, other anomalies and a very unstable gas plasma. Further, since changes in the gas plasma result in a different RF load in the processing chamber 12, the unstable gas plasma makes it very difficult for the tuning network 320 to match the impedance of the RF system to a desired value. Consequently, by initially creating the gas plasma at full RF power, a substantial amount of time is consumed waiting for the plasma to stabilize within the processing chamber 12 and thereafter, operating the tuning network 320 until the desired impedance match is established. With the plasma treatment system of the present invention, initially applying a lower or minimum level of power, for example, 30 watts, to the system permits the plasma in the chamber 12 to stabilize very quickly when compared to traditional systems.

After turning on the RF power supply 318 to the minimum power level, the control 304, at 620, executes a 200 millisecond delay. This delay period permits the plasma at the minimum power level to stabilize. Thereafter, at 622, the control 304 initiates the operation of an automatic tuning cycle or autotune control by which the variable air capacitors are used to match the RF impedance of the output of the power supply 318 and the RF impedance of the input of the processing chamber 12 to a desired impedance, for example, 50 ohms. During that process, analog feedback signals from the phase magnitude controls 322, 326 are provided on respective inputs 323, 329 of the control 304. The control executes a PID control loop and provides command signals on the outputs 328, 329 to operate the respective motors 321, 325 such that the variable air capacitors 320, 324 provide the desired impedance match.

The control then, at 624, determines whether the tuning network 320 has achieved the desired impedance match. When that occurs, the control 304, at 626, begins to ramp the power from its minimum level to a maximum level; and as the power is increased, the control, at 628, continues to operate the tuning network 320 with each successive power level. Thus, as the control moves from its minimum power level to the maximum power level, the variable air capacitor 320 is continuously adjusted so that the impedance presented to the RF power supply 318 remains matched to the desired 50 ohm load. Applicants have discovered that by maintaining the impedance match while ramping the RF power up to the maximum level, a stabilized gas plasma is achieved at full power in less time than if the RF power supply 318 were initially turned on to its maximum power level and the impedance matching operation executed.

It should be noted that as the power is ramping up to its maximum level, the process gases are flowing through the processing chamber 12 at their desired flow rates and the vacuum pump 144 is continuing to depressurize the processing chamber. As previously described, a range of operating pressure was determined by processing many workpieces using different process parameters. Using similar empirical methods, the maximum rate at which RF power can be increased while maintaining a tuned RF system was also determined; and that maximum rate of RF power increase provides a reduced plasma treatment cycle.

If the control 304, at 630, determines the RF power is not at its maximum level, the control, at 628, again increments the power level and operates the tuning network 320 to match the impedance to the desired value. If, at 630, the control 304 determines that the power is now at its maximum value, the control then, at 632, begins monitoring for an endpoint of the plasma treatment cycle while the power remains at its maximum value and the plasma treatment process continues. During a plasma treatment operation, contaminant species sputtered from the surface of workpiece 56 will be evacuated from processing space 102 via exhaust port 136 along with the flowing stream of process gas. Plasma treatment system 10 is optimized to enhance both the spatial uniformity of plasma treatment and system throughput.

The control 304, at 634, checks the state of the feedback signal on the input 352 from the end point detector 334 to determine whether the plasma processing cycle is complete. In the described embodiment, the endpoint of the processing cycle is determined by the endpoint detector 334 detecting a particular wavelength of light of the plasma and providing a signal representing such to the control 304. As will be appreciated, by processing a large number of workpieces using different processing parameters, the amount of time required to process a workpiece can be determined. In an alternative embodiment, the control 304 can start an internal timer at the same time that the autotune control is started at 622. The timer is set to the amount of time required to process a workpiece as was empirically determined. Therefore, when the internal timer expires indicating an end of the plasma processing cycle, the control at 304 detects the expiration of the timer as the endpoint of the plasma treatment cycle.

Upon the control, at 634, detecting a state of the end point feedback signal on the input 352 representing an end of the plasma treatment cycle, the control 304, at 636, provides a command signal on its output 350 to cause the RF power supply 318 to decrement or ramp down the RF power from its maximum level to its minimum level. Normally, the power is ramped down from its maximum level to its minimum level at the same rate and thus, over an identical time period, as is required to ramp the power up from its minimum level to its maximum level. Upon the control 304 detecting, at 638, that the RF power supply 318 is providing power at the minimum level, the control 304 then, at 640, the control 304 checks that the RF system is tuned at the minimum power level. Thereafter, at 642, the control 304 turns off the autotune control and executes a 200 millisecond delay which permits the plasma at the minimum power level to stabilize.

Traditional plasma processing cycles simply turn the RF generator off at the end of a processing cycle, and the tuning network is in a state corresponding to a processing power output from the RF power supply. Hence, when the next cycle is started, which may be at a different power level, some time is required to for the tuning network 320 to match the impedance. In contrast, with the present invention, at the end of a cycle, the tuning network is tuned to minimum power. Thus, at the start of the next processing cycle, when the RF power supply 318 is turned on to minimum power, the tuning network 320 is in a state such that, either, the desired impedance match already exists, or it can be quickly tuned to a match. Minimizing tuning of the RF system can result in cycle time savings of up to 15 seconds.

Next, the control 304, at 644, stops the operation of the pressure monitor and provides command signals on the outputs 342 and 346 to cause respective solenoid valves 341 and 315 to close the respective vacuum valve 140 and isolation valves 314. Further, the control 304 provides a command signal on output 344 to terminate the flowrate of gases through the appropriate mass flow controllers 312. In addition, the control 304 provides a command signal over an output 356 to cause solenoid valve 357 to open the bleed valve 54, thereby depressurizing the processing chamber 12. At 646, the control 304 determines that the pressure within the processing chamber 12 is substantially equal to atmospheric pressure. This determination is normally made by the control using an internal timer to measure a period of time required to depressurize the processing chamber 12 with the bleed valve 54. Thereafter, at 648, the control 304 provides a command signal on the output 337 causing the solenoid valve 338 to change state and reverse the operation of the lid actuator 122. Thereafter, at 650, the control 304 detects that the lid 14 is raised to its opened position and initiates a successive part transfer cycle 602. The above process is then repeated for successive workpieces.

Figure 6:
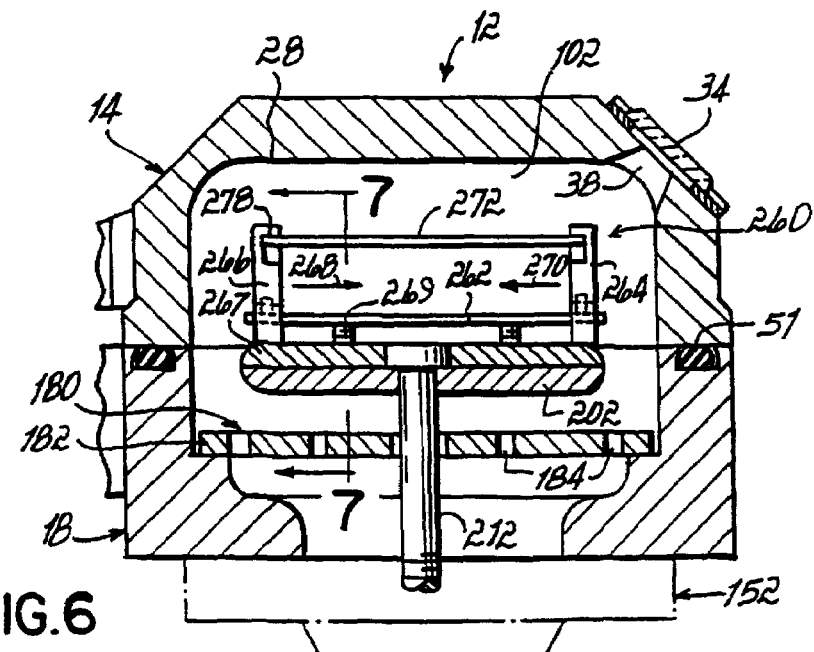
FIG. 6 is a side view of a substrate support in accordance with an alternative embodiment the principles of the present invention.
Figure 7:
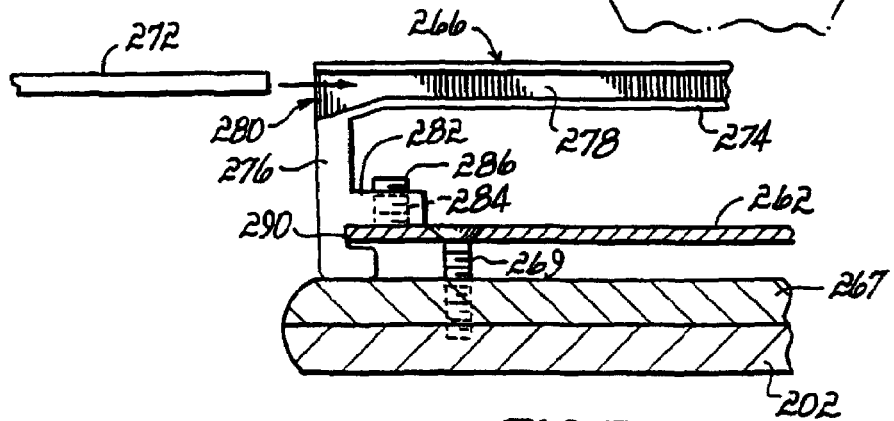
FIG. 7 is a partial front view of the substrate support of FIG. 6.

FIGS. 6 and 7 depict an alternative embodiment of the processing chamber 12 according to the principles of the present invention which includes a variable-width substrate support 260. Support 260 advantageously permits workpieces of variable dimension to be received thereon. Referring to FIG. 6, substrate support 260 includes an elevated platform 262 that slideably carries two moveable opposed side rails 264, 266 and a flat plate 267 that is attached to bottom electrode 202 by the downward force applied by each tie rod 212. Elevated platform 262 is mechanically and electrically attached by a plurality of fasteners 269 to flat plate 267. As shown by arrows 268, 270, side rails 264, 266 are moveable between an extreme position near the perimeter of support platform 262 to a central position along the longitudinal axis of elevated platform 262. As a result, the separation distance between sides rails 264, 266 may be varied to accommodate a workpiece 272 of a predetermined transverse width.

Side rail 264 and side rail 266 are identical structures that will be described with reference to side rail 266. Referring to FIG. 7, side rail 266 comprises a horizontal member 274 flanked at each opposed end by an integral vertical post 276. A channel 278 extends longitudinally along the entire length of horizontal member 274 and has a U-shaped cross-section with a predetermined width that accepts a peripheral edge of workpiece 272. Each opposed end of channel 278 includes a flared lip 280 that facilitates slideable capture of side edges of the workpiece 272.

Each vertical post 276 includes an upper prong 282 with a threaded bore 284 for receiving a set screw 286 and a beveled lower prong 288. The lower surface of upper 282 prong is displaced vertically from the upper surface of lower prong 288 to create an indentation 290 of a width that is slightly less than the thickness of elevated platform 262. The indentation 290 slideably receives a peripheral edge of elevated platform 262. Accordingly, each side rail 264, 266 may be independently moved to a predetermined transverse position and affixed with set screw 286.

The plasma treatment system described herein provides an exceptionally efficient, high quality and repeatable plasma treatment process. First, by turning the RF system off and on a lesser power, the plasma is started and stabilized in a shorter time than if the plasma were started at full RF power. In addition, by turning the system off and on at the lesser power, very little time, for example, one second, is used to initially tune the RF system. In traditional systems, up to fifteen seconds may be required to initially tune the system. Further, the plasma treatment system of the present invention initiates a flow of process gases at an upper pressure boundary well before the processing chamber has been evacuated to a normal processing pressure. Once again, processing cycle time is minimized with no compromise of plasma treatment quality. In addition, the plasma treatment system of the present invention allows the pressure in the processing chamber to vary over wide pressure limits without interruption to the treatment process or a loss of quality. The plasma treatment system described herein continuously operates the vacuum pump with the flow of process gases throughout the plasma treatment cycle such that the processing pressure is maintained but process gases flows are up to an order of magnitude greater than in known systems. Such flows minimize impurities and the deposition of material on components inside the processing chamber.

The plasma treatment system of the present invention includes a vacuum distribution baffle positioned between the workpiece and vacuum port that provides uniformly, symmetric flow lines of process gas across the surface of a workpiece undergoing plasma treatment. The substantially uniform delivery of process gas enhances the uniformity of the plasma density. The vacuum distribution baffle, if comprised of a ceramic, further restricts the portion of the processing space within the vacuum chamber in which the plasma is generated. The volume reduction advantageously reduces the plasma excitation power required to initiate and maintain a plasma and focuses the power on the workpiece. Further, the plasma treatment system of the present invention includes a gas distribution system that distributes process gases through an array of apertures, which are symmetrically positioned in a facing relationship to a surface of the workpiece. The uniformity of gas delivery enhances the uniformity of the plasma density. The plasma treatment system of the present invention has a workpiece holding portion that positions the workpiece equidistantly and symmetrically between the powered and ground electrodes. Such positioning enhances the uniformity of the plasma density and constrains the electric field lines to be substantially perpendicular to the surface of the workpiece. In addition, the plasma treatment system of the present invention includes a hinge coupling with an obround bearing that confines the chamber lid, when closed, to move substantially vertical relative to the chamber base when a vacuum pressure exists within the vacuum chamber. In addition to enhancing the quality of the vacuum seal between the chamber lid and the chamber base, the lifetime of the sealing member therebetween is maximized by the absence of relative transverse movement.

In combination, the above features of the plasma treatment system described herein provide exceeding fast processing cycle times and greater productivity than known machines. For example, with the plasma treatment system of the present invention, plasma processing times are in a range of from approximately eight seconds to approximately thirty seconds. In contrast, with known systems, plasma processing times are in a range of from approximately two minutes to approximately 10 minutes. Further, processing quality is substantially improved. For example, with known plasma processing cycles in a high volume batch production environment, using a contact angle measuring device, surface cleanliness and/or surface activation is typically considered acceptable with a 30° contact angle. Further, known plasma systems normally produce a surface cleanliness and/or surface activation measured by contact angles of from approximately 22° to approximately 30°. With the plasma treatment system of the present invention, in a high volume, batch processing environment, a contact angle of 12° +/− 2° can be maintained across the entire area of the workpiece. Further, that high quality is over 99% repeatable.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicant's general inventive concept. The scope of the invention itself should only be defined by the appended claims, wherein

I claim:

1. An apparatus for treating a workpiece with a plasma, comprising:
   a chamber having a processing space and a wall;
   a gas supply port in said chamber for introducing a process gas into said processing space;
   a workpiece holding portion positioned in said processing space and configured for holding the workpiece;
   a plasma excitation source operable for exciting process gas in said processing space to generate a plasma;
   a powered electrode electrically connected to said plasma excitation source and said workpiece holding portion;
   a vacuum port in said chamber for evacuating said processing space;
   a vacuum distribution baffle positioned between said vacuum port and said workpiece holding portion for uniformly dispersing process gas across said powered electrode, said vacuum distribution baffle operating for electrically shielding said powered electrode from said vacuum port and for preventing plasma generation in a portion of said processing space between said vacuum distribution baffle and said vacuum port; and
   an electrical feedthrough extending through said wall of said chamber and electrically coupled with said powered electrode, said electrical feedthrough extending through said vacuum distribution baffle.

2. The apparatus of claim 1, wherein said powered electrode is part of an assembly which includes said workpiece holding portion.

3. The apparatus of claim 1, wherein said workpiece holding portion includes first and second side rails that are adjustable in width to accommodate workpieces of different widths positioned therebetween.

4. The apparatus of claim 1, wherein the chamber further comprises a lid, a lower chamber portion, and a sealing member between said lid and said lower chamber portion, said lid movable relative to said lower chamber portion between an open position and a closed position in which said sealing member forms a seal between said lid and said lower chamber portion, said lid being connected to said lower chamber portion by a hinge having a slotted opening and a hinge pin positioned in said slotted opening, said slotted opening oriented such that said lid moves vertically relative to said lower chamber portion for compressing said sealing member when said lid is in the closed position and said processing space is evacuated through said vacuum port.

5. The apparatus of claim 1 further comprising:
   a ground electrode positioned on an opposite side of said workpiece holding portion relative to said powered electrode.

6. The apparatus of claim 5, wherein said powered electrode and said ground electrode are approximately equidistant from said workpiece holding portion, said electrodes producing an electric field substantially perpendicular to the workpiece when said workpiece is held in said workpiece holding portion.

7. The apparatus of claim 6, wherein said chamber includes a lid movable between open and closed positions for accessing said workpiece holding portion, said lid further comprising said ground electrode.

8. The apparatus of claim 1, wherein said chamber includes a lid movable between open and closed positions for accessing said workpiece holding portion, and said gas supply port is positioned in said lid for introducing the process gas to said processing space.

9. The apparatus of claim 8, wherein said lid includes an interior surface facing said workpiece holding portion of said processing space when said lid is in said closed position, and said gas supply port further comprises a gas distribution space within said lid and an array of apertures on said interior surface configured to uniformly distribute the process gas from said gas distribution space onto the workpiece.

10. The apparatus of claim 1, wherein said chamber further comprises a lower chamber portion, a lid movable relative to said lower chamber portion between open and closed positions for accessing said workpiece holding portion, and a sealing member between said lid and said lower chamber portion, said sealing member being electrically conductive so that said lid and said lower chamber portion are in electrical continuity when said lid is in said closed position.

11. The apparatus of claim 1 wherein said vacuum distribution baffle includes a plate having a plurality of orifices that permit the process gas to flow from said gas supply port to said vacuum port.

12. The apparatus of claim 11 wherein said chamber includes a chamber base, said plate is positioned between said chamber base and said powered electrode, said powered electrode includes a perimeter, and said vacuum port is symmetrically positioned in said chamber base relative to said perimeter.

13. The apparatus of claim 1 wherein said vacuum port is located in said chamber below said powered electrode, and said vacuum port has a centerline oriented substantially perpendicular to said powered electrode.

14. The apparatus of claim 13 wherein said powered electrode is located below said gas supply port.

15. The apparatus of claim 13 wherein said vacuum port is centrally located in said chamber below said powered electrode.

16. The apparatus of claim 1 wherein said vacuum distribution baffle is located below said powered electrode and above said vacuum port for uniformly dispersing process gas across said powered electrode.

17. The apparatus of claim 16 wherein said vacuum port is located in said chamber below said powered electrode, and said vacuum port has a centerline oriented substantially perpendicular to said powered electrode.

* * * * *